(12) United States Patent
Shirahata et al.

(10) Patent No.: US 9,598,768 B2
(45) Date of Patent: *Mar. 21, 2017

(54) METHOD OF FORMING ZINC OXIDE FILM (ZNO) OR MAGNESIUM ZINC OXIDE FILM (ZNMGO) AND APPARATUS FOR FORMING ZINC OXIDE FILM OR MAGNESIUM ZINC OXIDE FILM

(75) Inventors: Takahiro Shirahata, Tokyo (JP); Hiroyuki Orita, Tokyo (JP); Akio Yoshida, Tokyo (JP); Masahisa Kogura, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 151 days.

This patent is subject to a terminal disclaimer.

(21) Appl. No.: 13/059,356

(22) PCT Filed: Sep. 24, 2008

(86) PCT No.: PCT/JP2008/067159
§ 371 (c)(1),
(2), (4) Date: Feb. 16, 2011

(87) PCT Pub. No.: WO2010/035312
PCT Pub. Date: Apr. 1, 2010

(65) Prior Publication Data
US 2011/0143053 A1    Jun. 16, 2011

(51) Int. Cl.
*C23C 16/448* (2006.01)
*C23C 16/40* (2006.01)
(Continued)

(52) U.S. Cl.
CPC ........ *C23C 16/4486* (2013.01); *C23C 16/407* (2013.01); *C23C 16/452* (2013.01);
(Continued)

(58) Field of Classification Search
CPC ... C23C 16/4486; C23C 18/12; C23C 16/407; C23C 18/1279; C23C 18/1291;
(Continued)

(56) References Cited

U.S. PATENT DOCUMENTS 3,833,492 A * 9/1974 Bollyky ............... C01B 13/11
   204/176
5,002,796 A   3/1991 Nishida
(Continued)

FOREIGN PATENT DOCUMENTS

CN   1873051 A   12/2006
CN   101058867 A  10/2007
(Continued)

OTHER PUBLICATIONS

Chemical Kinetics in the Atmosphere: Application to Ozone (hereafter Colorado) found at http://www.colorado.edu/chemistry/chem5151/Chapter4ChemKin.pdf (Oct. 10, 2004).*
(Continued)

*Primary Examiner* — Dah-Wei D Yuan
*Assistant Examiner* — Jose Hernandez-Diaz
(74) *Attorney, Agent, or Firm* — Oblon, McClelland, Maier & Neustadt, L.L.P.

(57) ABSTRACT

A method of forming a zinc oxide film or a magnesium zinc oxide film which has a high transmittance. The method of forming a zinc oxide film or a magnesium zinc oxide film includes (A) converting a solution containing zinc, or zinc and magnesium into mist, (B) heating a substrate, and (C) supplying the solution converted into mist, and ozone to a first main surface of the substrate under heating.

29 Claims, 4 Drawing Sheets

(51) Int. Cl.
  *C23C 16/48* (2006.01)
  *C23C 18/12* (2006.01)
  *H01L 21/02* (2006.01)
  *C23C 16/452* (2006.01)
  *C23C 16/455* (2006.01)

(52) U.S. Cl.
  CPC ...... *C23C 16/45523* (2013.01); *C23C 16/482* (2013.01); *C23C 18/12* (2013.01); *C23C 18/1216* (2013.01); *C23C 18/1279* (2013.01); *C23C 18/1291* (2013.01); *H01L 21/0262* (2013.01); *H01L 21/02554* (2013.01); *H01L 21/02565* (2013.01); *H01L 21/02628* (2013.01)

(58) Field of Classification Search
  CPC ............ C23C 16/452; C23C 16/45523; C23C 16/482; C23C 18/1216; H01L 21/02628; H01L 21/02554; H01L 21/02565; H01L 21/0262
  USPC .................................. 427/453, 576, 581, 573
  See application file for complete search history.

(56) References Cited

U.S. PATENT DOCUMENTS

| | | | |
|---|---|---|---|
| 5,145,350 A * | 9/1992 | Dawson | C01B 13/11 422/186.07 |
| 5,578,280 A * | 11/1996 | Kazi | B01J 19/088 422/186.07 |
| 5,980,983 A * | 11/1999 | Gordon | 427/226 |
| 6,110,544 A | 8/2000 | Yang et al. | |
| 6,235,112 B1 * | 5/2001 | Satoh | 118/300 |
| 6,432,494 B1 | 8/2002 | Yang et al. | |
| 6,511,718 B1 * | 1/2003 | Paz de Araujo et al. | 427/576 |
| 6,576,302 B1 * | 6/2003 | Mizuta et al. | 427/597 |
| 7,244,474 B2 * | 7/2007 | Hanawa et al. | 427/562 |
| 7,582,161 B2 * | 9/2009 | Ahn | C23C 16/407 117/105 |
| 2008/0066677 A1 * | 3/2008 | Morozumi | C23C 16/45548 118/715 |
| 2008/0081151 A1 * | 4/2008 | Kobrin et al. | 428/141 |
| 2009/0152098 A1 * | 6/2009 | Hooper | A61M 5/3129 204/176 |

FOREIGN PATENT DOCUMENTS

| | | |
|---|---|---|
| DE | 3916983 | 11/1989 |
| DE | 69837954 | 2/2008 |
| JP | 6-224131 A | 8/1994 |
| JP | 11 209876 | 8/1999 |
| JP | 2000 239846 | 9/2000 |
| JP | 2007 109406 | 4/2007 |

OTHER PUBLICATIONS

Chinese Office Action issued Sep. 3, 2012, in China Patent Application No. 200880131323.7 (with English translation).
Lu, J.G. et al., "ZnO-Based Thin Films Synthesized by Atmospheric Pressure Mist Chemical Vapor Deposition", Journal of Crystal Growth, vol. 299, pp. 1-10 (2007).
Niki, S. et al., "ZnO-Based Transparent Conducting Oxide Films", The Journal of the Vacuum Society of Japan, vol. 50, No. 2, pp. 114-117 (2007).
International Search Report Issued Jan. 13, 2009 in PCT/JP08/067159 filed Sep. 24, 2008.
Combined Chinese Office Action and Search Report issued Jan. 14, 2013 in Chinese Patent Application No. 200880131323.7 (with Japanese and partial English-language translation).
Office Action issued Feb. 1, 2013 in Korean Patent Application No. 10-2011-7005548 (with Japanese and Partial English-language translation).
U.S. Appl. No. 13/383,766, filed Jan. 12, 2012, Orita, et al.
U.S. Appl. No. 13/059,128, filed Feb. 15, 2011, filed Orita, et al.
U.S. Appl. No. 14/131,128, filed Jan. 6, 2014, Orita, et al.
Office Action issued Jun. 26, 2012 in Japanese Patent Application No. 2010-530643 (with partial English translation).
U.S. Appl. No. 13/265,193, filed Nov. 8, 2011, Orita, et al.
Decision of Rejection issued Mar. 19, 2013 in Japanese patent Application No. 2010-530643 (partial English translation).
Tadatsugu Minami, "Chapter Two ZnO Transparent Conductive Film", Transparent Conductive Film, CMC Publishing Co., Ltd., Sep. 26, 2005, pp. 6-19.
Chinese Office Action issued Jun. 21, 2013, in China Patent Application No. 200880131323.7 (with English translation).
German Office Action issued Feb. 26, 2016 in connection with corresponding German Patent Application No. 11 2008 004 011.7, filed Sep. 24, 2008.

* cited by examiner

METHOD OF FORMING ZINC OXIDE FILM (ZNO) OR MAGNESIUM ZINC OXIDE FILM (ZNMGO) AND APPARATUS FOR FORMING ZINC OXIDE FILM OR MAGNESIUM ZINC OXIDE FILM

CROSS REFERENCE TO RELATED APPLICATION

This application is a 371 of PCT/JP2008/067159, filed on Sep. 24, 2008.

TECHNICAL FIELD

The present invention relates to a film formation method of forming a ZnO film or a ZnMgO film on a substrate, and a film formation apparatus which is capable of carrying out the method of forming a ZnO film or a ZnMgO film.

BACKGROUND ART

In the fields of solar batteries, light emitting devices and touch panels or the like, a metal oxide film having transparency is formed on a substrate. As techniques for forming a ZnO film as the metal oxide film on the substrate, those disclosed in Patent Document 1 and Non-Patent Document 1 conventionally exist.

In the technique according to Patent Document 1, a film is formed by an ion plating method using a ZnO sintered body containing 0.5 to 16% of $Ga_2O_3$. In the technique according to Non-Patent Document 1, a ZnO film is formed on a substrate by a pulse laser accumulation method of irradiating a ZnO sintered body with KrF laser.

Patent Document 1: Japanese Patent Application Laid-Open No. 2007-109406

Non-Patent Document 1: The Journal of the Vacuum Society of Japan Vol. 50 (2007), No. 2, 114-117

DISCLOSURE OF THE INVENTION

Problems to be Solved by the Invention

However, Patent Document 1 has a problem that a film formation apparatus is complicated and large, and also costs increase. When the ZnO film is formed by the technique according to Patent Document 1, a transmittance becomes 80% or less when the thickness of the film exceeds 400 nm. Since the transmittance decreases in such a state of the film thickness, the technique according to Patent Document 1 is not suited when the ZnO film having a large thickness is to be formed.

In Non-Patent Document 1, the transmittance is improved even in the case of the ZnO film having a large thickness compared with the case of Patent Document 1. For example, when a Ga-doped ZnO film is formed on the substrate, the transmittance of the ZnO film becomes 81% at the film thickness of 500 nm. When an Al-doped ZnO film is formed on the substrate, the transmittance of the ZnO film becomes 92% at the film thickness of 500 nm. However, even in the case of the technique according to Non-Patent Document 1, there is a problem that a film formation apparatus is complicated and large, and also costs increase similarly to the case of the technique according to Patent Document 1.

Thus, an object of the present invention is to provide a method of forming a zinc oxide film or a magnesium zinc oxide film which has a high transmittance. Another object of the present invention is to provide a film formation apparatus capable of carrying out the method of forming a zinc oxide film or a magnesium zinc oxide film, which has a simple constitution, and is preferably provided at low costs.

Means for Solving the Problems

To achieve the above objects, according to a first aspect of the present invention, a method of forming a zinc oxide film or a magnesium zinc oxide film includes the steps of (A) converting a solution containing zinc, or zinc and magnesium into mist, (B) heating a substrate, and (C) supplying the solution converted into mist in the step (A) and ozone to a first main surface of the substrate in the step (B).

According to a second aspect of the present invention, a method of forming a zinc oxide film or a magnesium zinc oxide film includes the steps of (V) converting a solution containing zinc, or zinc and magnesium into mist, (W) supplying the solution converted into mist in the step (V), and oxygen or ozone to a first main surface of a substrate, and (X) irradiating the oxygen or the ozone with ultraviolet rays.

According to a third aspect of the present invention, a method of forming a zinc oxide film or a magnesium zinc oxide film includes the steps of (V) converting a solution containing zinc, or zinc and magnesium into mist, (W) supplying the solution converted into mist in the step (V), and oxygen or ozone to a first main surface of a substrate, and (X) converting the oxygen or the ozone into plasma.

According to a fourth aspect of the present invention, the method of forming a zinc oxide film or a magnesium zinc oxide film according to any one of claims 1 to 15 is carried out by an apparatus for forming a zinc oxide film or a magnesium zinc oxide film.

Effects of the Invention

According to the first aspect of the present invention, a zinc oxide film or a magnesium zinc oxide film is formed while ozone is added. Therefore, ozone and active oxygen produced by decomposition of ozone due to heat or the like are rich in reactivity, thus promoting decomposition and oxidation of a material compound in a solution. Whereby, a thick zinc oxide film or a thick magnesium zinc oxide film which has a high transmittance can be formed on a substrate.

According to the second and third aspects of the present invention, ozone (or oxygen) is supplied toward a substrate and the ozone (or oxygen) is irradiated with ultraviolet rays or converted into plasma. Therefore, it is possible to promote, in addition to the above effect, the reaction for formation of a zinc oxide film or a magnesium zinc oxide film on a first main surface of a substrate. It also becomes possible to omit a heat treatment to the substrate, or to suppress a heating temperature in the heat treatment.

According to the fourth aspect of the present invention, the method of forming a zinc oxide film or a magnesium zinc oxide film according to any one of claims 1 to 3 is carried out. Therefore, it is possible to provide the film formation apparatus having a simple constitution. In addition, in the film formation apparatus capable of carrying out the method of forming a zinc oxide film or a magnesium zinc oxide film according to claim 1 and claim 2, it is possible to realize low costs of the entire apparatus.

Objects, features, aspects and advantages of the present invention will become more apparent from the following detailed descriptions taken in conjunction with the accompanying drawings.

BEST MODE FOR CARRYING OUT THE INVENTION

<Embodiment 1>

Figure 1:
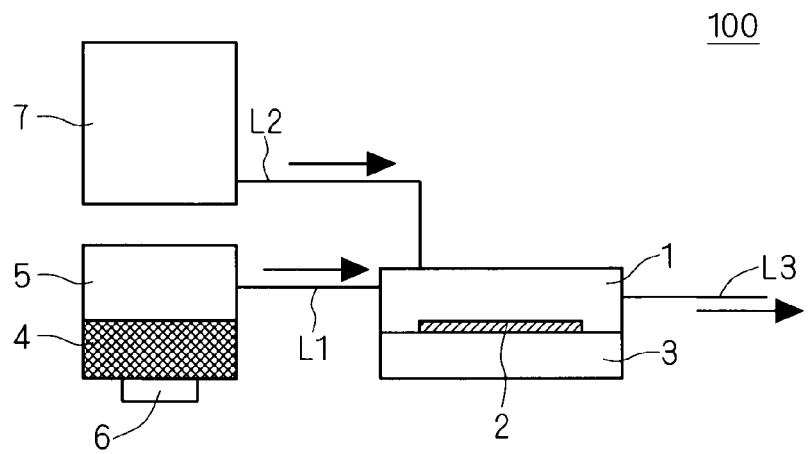
FIG. 1 is a diagram showing a constitution of an apparatus for forming a zinc oxide film or a magnesium zinc oxide film according to an embodiment 1.

FIG. 1 is a diagram showing a schematic constitution of an apparatus for forming a zinc oxide film (ZnO film) or a magnesium zinc oxide film (ZnMgO film) according to the present embodiment.

As shown in FIG. 1, an apparatus 100 for forming a zinc oxide film or a magnesium zinc oxide film according to the embodiment 1 is composed of a reaction vessel 1, a heating device 3, a solution container 5, a misting device 6 and an ozone generator 7.

In the film formation apparatus 100, a spray pyrolysis method, a pyrosol method, a mist accumulation method or the like is carried out. In other words, in the film formation apparatus 100, by spraying a predetermined solution converted into mist to a first main surface of a substrate 2, a zinc oxide film or a magnesium zinc oxide film can be formed on the first main surface of the substrate 2.

In a state where the substrate 2 is placed on the heating device 3, a zinc oxide film or a magnesium zinc oxide film is formed on the first main surface of the substrate 2 by a predetermined reaction inside the reaction vessel 1. A second main surface of the substrate 2 is placed on the heating device 3. As is apparent from the above description, the first main surface of the substrate 2 referred to in the present description is a main surface of the substrate 2 on the side on which the zinc oxide film or the magnesium zinc oxide film is formed. To the contrary, the second main surface of the substrate 2 referred to in the present description is a main surface of the substrate 2 on the side to be placed on the heating device 3.

Herein, after controlling the pressure inside the reaction vessel 1 to an atmospheric pressure, the zinc oxide film or the magnesium zinc oxide film may be formed on the substrate 2 under the atmospheric pressure. Alternatively, while evacuating inside the reaction vessel 1 within a range from 0.0001 to 0.1 MPa, the zinc oxide film or the magnesium zinc oxide film may be formed on the substrate 2 under the reduced pressure environment.

It is possible to employ, as the substrate 2, a glass substrate, a flexible substrate such as a resin film, and a plastic substrate used in the fields of flat panel displays such as solar batteries, light emitting devices, light receiving elements, touch panels and liquid crystal panels.

The heating device 3 is a heater or the like, and can heat the substrate 2 placed on the heating device 3. The heating device 3 is heated to a zinc oxide film formation temperature or a magnesium zinc oxide film formation temperature by an external controller.

The solution container 5 is filled with a material solution (hereinafter referred to as a solution) 4 for formation of a zinc oxide film or a magnesium zinc oxide film. The solution 4 contains, as a metal source, zinc (Zn), or zinc (Zn) and magnesium (Mg). More specifically, the solution 4 contains a compound containing at least either zinc (Zn) or magnesium (Mg). Herein, the compound is at least one of an alkoxide compound, a β-diketone compound, a carboxylate compound, a halogen compound, an alkyl compound and a cyclopentadienyl compound.

The solution 4 does not have to contain a dopant source described later. However, the solution 4 preferably contains, as the dopant source, at least any one of boron (B), nitrogen (N), fluorine (F), aluminum (Al), phosphorus (P), chlorine (Cl), gallium (Ga), arsenic (As), niobium (Nb), indium (In) and antimony (Sb).

It is possible to employ, as a solvent of the solution 4, water, alcohols such as ethanol and methanol, and a mixed liquid of these liquids.

As the misting device 6, for example, an ultrasonic atomizer can be employed. The misting device 6, which is the ultrasonic atomizer, enables the solution 4 in the solution container 5 to convert into mist by applying ultrasonic wave to the solution 4 in the solution container 5. The solution 4 converted into mist is supplied toward the first main surface of the substrate 2 in the reaction vessel 1 through a path L1.

The ozone generator 7 can generate ozone. Ozone produced in the ozone generator 7 is supplied toward the first main surface of the substrate 2 in the reaction vessel 1 through a path L2 which is different from the path L1. In the ozone generator 7, for example, a high voltage is applied between parallel electrodes disposed in parallel and oxygen is passed through the electrodes, thereby decomposing oxygen molecules, resulting in bonding with other oxygen molecules, and thus ozone can be generated.

When ozone and the misty solution 4 are supplied into the reaction vessel 1, the ozone reacts with the solution 4 on the substrate 2 under heating to form a zinc oxide film or a magnesium zinc oxide film on the first main surface of the substrate 2. The ozone and the solution 4 remaining in the reaction vessel 1 without being reacted are always (continuously) discharged out of the reaction vessel 1 through a path L3.

The method of forming a zinc oxide film or a magnesium zinc oxide film according to the present embodiment will be described below.

In the solution container 5, the solution 4 is converted into mist by the misting device 6. The solution 4 converted into mist is supplied to the reaction vessel 1 through the path L1. Herein, the solution 4 contains zinc, or zinc and magnesium as the metal source. On the other hand, ozone is produced in the ozone generator 7. Ozone thus produced is supplied to the reaction vessel 1 through the path L2.

On the other hand, the substrate 2 placed on the heating device 3 is heated to a zinc oxide film formation temperature or a magnesium zinc oxide film formation temperature by the heating device 3, and the temperature of the substrate 2 is maintained at each film formation temperature.

Decomposition of ozone is initiated at about 200° C. (namely, production of oxygen radicals from ozone is initiated at a heating temperature of 200° C.). Therefore, even when the heating temperature of the substrate 2 is about 200° C., it is possible to form a zinc oxide film or a magnesium zinc oxide film on the substrate 2. Commonly, 90% of ozone is decomposed at 350° C. in 3 seconds, and nearly 100% of ozone is decomposed at 500° C. in about 0.5 to 0.6 seconds. Therefore, for the purpose of increasing a film formation speed of a metal oxide film, the heating temperature of the substrate 2 may be increased.

Ozone and the misty solution 4 are supplied to the first main surface of the substrate 2 in the heated state. When the ozone and the misty solution 4 are contacted with the substrate 2 in the heated state, ozone is thermally decomposed to produce oxygen radicals and decomposition of the solution 4 is promoted by the oxygen radicals, and a predetermined metal oxide film is formed on the first main surface of the substrate 2. Specifically, when the solution 4 contains only zinc as the metal source, a zinc oxide film is formed on the first main surface of the substrate 2. On the other hand, when the solution 4 contains zinc and magnesium as the metal source, a magnesium zinc oxide film is formed on the first main surface of the substrate 2.

Herein, the film formation step may be the step of supplying the solution 4 and ozone to the substrate 2 arranged under an atmospheric pressure to form a zinc oxide film or a magnesium zinc oxide film on the substrate 2. To the contrary, it may be the step of supplying the solution 4 and ozone to the substrate 2 arranged under a reduced pressure (for example, 0.0001 to 0.1 MPa) environment by separately providing a film formation apparatus 100 with a vacuum pump (not shown) capable of evacuating inside the reaction vessel 1 to form a zinc oxide film or a magnesium zinc oxide film on the substrate 2.

As described above, in the method of forming a zinc oxide film or a magnesium zinc oxide film according to the present embodiment, the solution 4 containing zinc, or zinc and magnesium, as a metal source, dissolved therein is converted into mist. For example, the solution 4 contains a compound containing either zinc or magnesium, and the compound is at last one of an alkoxide compound, a β-diketone compound, a carboxylate compound, a halogen compound, an alkyl compound and a cyclopentadienyl compound. Furthermore, in the reaction vessel 1 in an atmosphere containing ozone, the misty solution 4 is contacted with the substrate 2 under heating.

Therefore, since ozone, and active oxygen produced by decomposition of ozone due to heat or the like are rich in reactivity, thus promoting decomposition and oxidation of a material compound in the solution 4. Whereby, a zinc oxide film or a magnesium zinc oxide film which has a high transmittance can be formed on the substrate 2. The transmittance improving effect is apparent from a comparison between FIG. 2 and FIG. 3.

Figure 2:
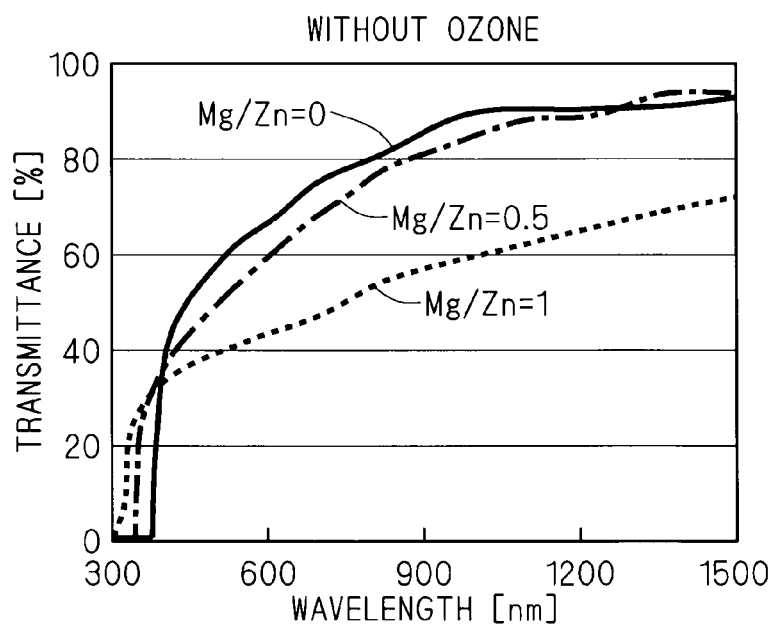
FIG. 2 is a graph showing a relationship between the transmittance and the wavelength of a zinc oxide film or a magnesium zinc oxide film formed under film formation conditions without the addition of ozone.
Figure 3:
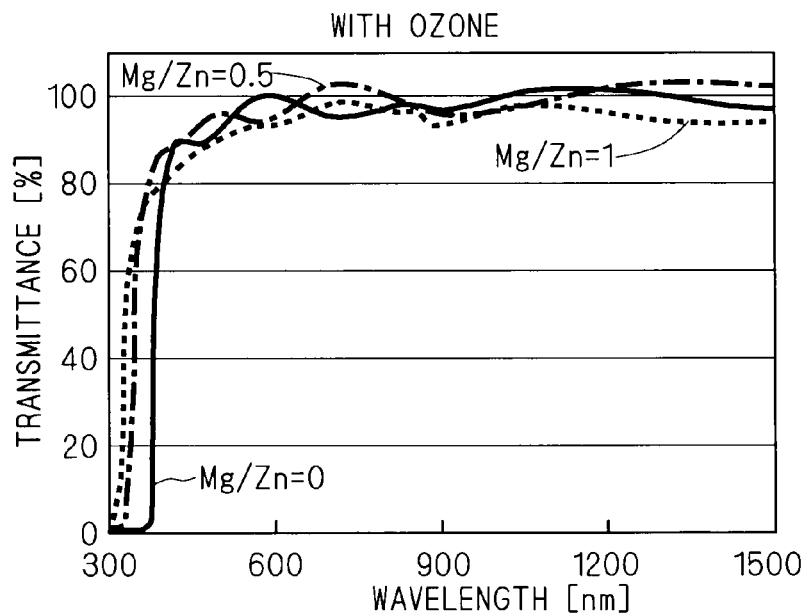
FIG. 3 is a graph showing a relationship between the transmittance and the wavelength of a zinc oxide film or a magnesium zinc oxide film formed by a film formation method according to the embodiment 1.

FIG. 2 and FIG. 3 are experimental results showing a relationship between the transmittance and the wavelength of light of a zinc oxide film or a magnesium zinc oxide film to be formed. Film formation conditions of a zinc oxide film or a magnesium zinc oxide film formed in the case of an experiment shown in FIG. 2 and film formation conditions of a zinc oxide film or a magnesium zinc oxide film formed in the case of an experiment shown in FIG. 3 are different only in terms of presence or absence of supply of ozone.

The zinc oxide film or the magnesium zinc oxide film used in the experiment shown in FIG. 2 is formed under film formation conditions without the addition of ozone. The zinc oxide film or the magnesium zinc oxide film used in the experiment shown in FIG. 3 is formed under film formation conditions in the presence of ozone. In other words, the zinc oxide film or the magnesium zinc oxide film used in the experiment shown in FIG. 3 is formed by the film formation method according to the present embodiment.

In FIGS. 2 and 3, data of "Mg/Zn=0" are concerned with a zinc oxide film, while data of "Mg/Zn=0.5" and data of "Mg/Zn=1" are concerned with a magnesium zinc oxide film. Herein, "Mg/Zn" denotes a ratio of the content of zinc to that of magnesium in the solution 4. In FIGS. 2 and 3, the horizontal axis denotes a wavelength of light (nm), while the vertical axis denotes a transmittance (%) of the film formed.

As is apparent from a comparison between FIG. 2 and FIG. 3, the transmittance of the zinc oxide film or the magnesium zinc oxide film is improved when the zinc oxide film or the magnesium zinc oxide film is formed by adding ozone. As shown in FIG. 3, when the wavelength is within a range from 350 nm to 1,500 nm, the transmittance is nearly constant at a high value (the transmittance is 90% or more within the above wavelength range).

For example, in a zinc oxide film having a thickness of 350 nm formed under the conditions where ozone is added, the average transmittance is 91% at a wavelength within a range from 300 to 1,500 nm. Alternatively, in a magnesium zinc oxide film (Mg/Zn=0.5) having a thickness of 500 nm formed under the conditions where ozone is added, the average transmittance is 94.5% at a wavelength within a range from 300 to 1,500 nm.

Furthermore, in a magnesium zinc oxide film (Mg/Zn=1) having a thickness of 680 nm formed under the conditions where ozone is added, the average transmittance is 91.2% at a wavelength within a range from 300 to 1,500 nm.

In a zinc oxide film and a magnesium zinc oxide film formed under the conditions where ozone is not added, the average transmittance was about 70% at a wavelength within a range from 300 to 1,500 nm, although it varied depending on the thickness of the film.

As is apparent from the above description, although ozone is used in the method of forming a zinc oxide film or a magnesium zinc oxide film according to the present embodiment, it is not necessary to use an acid or an alkali in the solution 4.

Therefore, it becomes possible to form a zinc oxide film or a magnesium zinc oxide film having poor resistance to an acid or an alkali.

The apparatus 100 for forming a zinc oxide film or a magnesium zinc oxide film shown in FIG. 1 is only provided with devices which have a simple structure and a small size, such as the ozone generator 7, the misting device 6 and the heating device 3.

Therefore, it becomes possible to miniaturize the entire film formation apparatus 100, and thus the film formation apparatus 100 can be provided at low costs.

In a state where the solution 4 contains zinc, or zinc and magnesium, the solution 4 may contain, as a dopant, at least any one of boron, nitrogen, fluorine, aluminum, phosphorus, chlorine, gallium, arsenic, niobium, indium and antimony.

Inclusion of the dopant produces an electron-excessive state or an electron-deficient state in a molecular structure of the zinc oxide film or the magnesium zinc oxide film to be formed, resulting in formation of carries, and thus electric resistance of a transparent conductive film is allowed to further deteriorate.

As described above, after controlling the pressure inside the reaction vessel 1 to an atmospheric pressure, a zinc oxide film or a magnesium zinc oxide film may be formed on the substrate 2 under the atmospheric pressure.

Whereby, the constitution such as a vacuum device can be omitted, and therefore costs of the film formation apparatus 100 can be further reduced.

To the contrary, as described above, it is possible to provide a vacuum pump or the like capable of evacuating inside the reaction vessel 1. While evacuating inside the reaction vessel 1 within a range from 0.0001 to 0.1 MPa, a zinc oxide film or a magnesium zinc oxide film may be formed on the substrate 2 under the reduced pressure environment.

Whereby, costs of the film formation apparatus 100 increase, but it becomes possible to form a zinc oxide film or a magnesium zinc oxide film with better quality on the substrate 2 compared with a zinc oxide film or a magnesium zinc oxide film formed under an atmospheric pressure.

Also, as is apparent from the constitution of FIG. 1, the solution 4 and ozone are supplied to the substrate 2 through different paths. In the constitution of FIG. 1, the solution 4 is supplied toward the substrate 2 in the reaction vessel 1 through the path L1. On the other hand, ozone is supplied toward the substrate 2 in the reaction vessel 1 through the path L2.

As described above, by supplying the solution 4 and ozone to the substrate 2 through the different paths L1, L2, it is possible to limit the position where ozone and the solution 4 are mixed with each other to only the reaction vessel 1 (a range where the substrate 2 is disposed). In other words, it is possible to prevent the solution 4 and ozone from mixing with each other in a path of the supply process. Therefore, it is possible to limit the range of the reaction between the solution 4 and ozone to only the range where the substrate 2 is disposed, and to improve the reaction efficiency at the substrate 2. By mixing the solution 4 and ozone with each other in the supply process, the solution 4 may react with ozone to produce an unintended reaction product in a vapor phase before arrival to the substrate. The production of the unintended reaction product may prevent the growth of a film on a surface of the substrate (deterioration in film quality and decrease in film formation rate by accumulation of the unintended reaction product). Herein, the production of the unintended reaction product can be suppressed by supplying the solution 4 and ozone to the substrate 2 through the different paths L1, L2.

The film formation apparatus 100 may be further provided with a controller (not shown) capable of performing the following control. The controller performs the control so that the solution 4 converted into mist and ozone are supplied to the substrate 2 in the reaction vessel 1 simultaneously or separately at predetermined timings.

By simultaneously supplying the solution 4 converted into mist and ozone to the substrate 2 in the reaction vessel 1, ozone reactivity (oxidizability) in the reaction vessel 1 can be sufficiently utilized.

On the other hand, by supplying the solution 4 converted into mist and ozone to the substrate 2 in the reaction vessel 1 alternately or in a predetermined order, the reaction between ozone and the solution 4 converted into mist in a vapor phase in the reaction vessel 1 at a position other than the surface of the substrate 2 can be suppressed. Whereby, it is possible to suppress formation of a powdered product having poor crystallinity on the substrate 2.

By supplying the solution 4 converted into mist and ozone to the substrate 2 in the reaction vessel 1 alternately or in a predetermined order, it becomes impossible to sufficiently utilize ozone reactivity (oxidizability) in the reaction vessel 1. However, characteristics of the metal oxide film to be formed are improved by supplying ozone while heating the substrate 2 (for example, improvement in crystallinity and improvement in electric resistance depending on mobility and carrier concentration).

<Embodiment 2>

Figure 4:
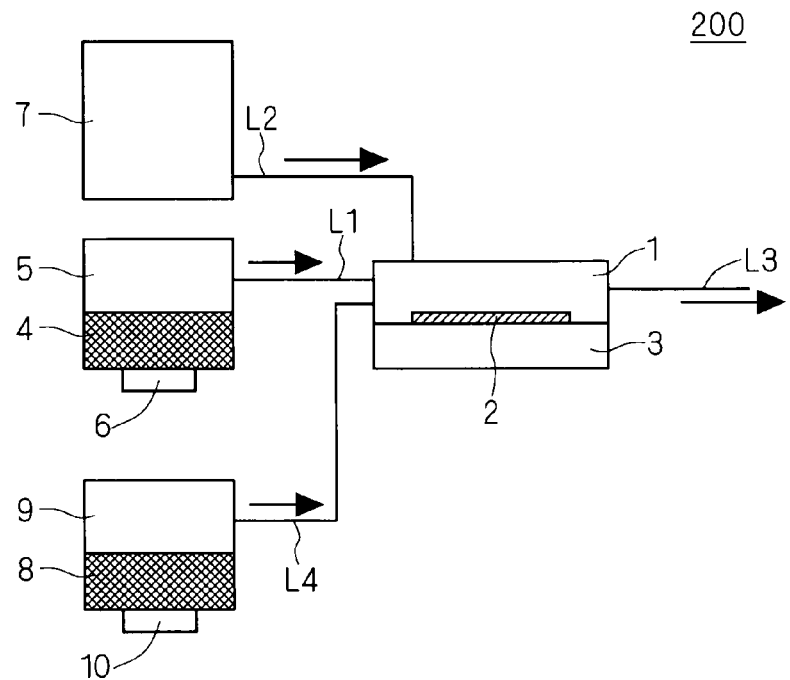
FIG. 4 is a diagram showing a constitution of an apparatus for forming a zinc oxide film or a magnesium zinc oxide film according to an embodiment 2.

FIG. 4 is a diagram showing a schematic constitution of an apparatus for forming a zinc oxide film or a magnesium zinc oxide film according to the As shown in FIG. 4, concerning an apparatus 200 for forming a zinc oxide film or a magnesium zinc oxide film according to the embodiment 2, a solution container 9 and a misting device 10 are separately added to the apparatus 100 for forming a zinc oxide film or a magnesium zinc oxide film according to the embodiment 1.

The solution container 9 is filled with a solution 8 which is different from the solution 4 with which the solution container 5 is filled. As shown in FIG. 4, the misting device 10 is arranged in the solution container 9 and converts the solution 8 in the solution container 9 into mist. Herein, the misty solution 8 is sprayed over the substrate 2 in the reaction vessel 1 through a path L4 different from the path L1 and the path L2.

The film formation apparatus 200 has the same constitution as that of the film formation apparatus 100, except for the separately added constitution, and the same numerals are used for the same constitutions. Concerning the description of the same constitution and the operation of the constitution, refer to the embodiment 1.

The film formation apparatus 200 converts the solution 4 into mist, and also converts the solution 8 which is different from the solution 4 into mist. The film formation apparatus 200 is provided with a controller (not shown), and the solution 4 and the solution 8 are supplied to the substrate 2 in the following manner in accordance with control of the controller.

In other words, in accordance with control of the controller, the different solutions 4, 8 converted into mist may be simultaneously supplied to the substrate 2. In accordance with control of the controller, the different solutions 4, 8 converted into mist may also be supplied to the substrate 2 in a predetermined order (the solution 8 converted into mist is supplied after supplying the solution 4 converted into mist, and thus supply of the solutions 4, 8 is completed, or the solution 4 converted into mist is supplied after supplying the solution 8 converted into mist, and thus supply of the solutions 4, 8 is completed). In accordance with control of the controller, the different solutions 4, 8 converted into mist may be supplied to the substrate 2 alternately and repeatedly (for example, supply of the solution 4→supply of the solution 8→supply of the solution 4→supply of the solution 8→completion of supply of the solutions 4, 8).

By employing the film formation apparatus 200 according to the present embodiment, various metal oxide films having a multi-layered structure including a zinc oxide film or a magnesium zinc oxide film can be formed on the substrate 2. It is also possible to select a solvent which is suited for each material. For example, although zinc acetate as a metal source is easily soluble in water and alcohols, aluminum acetylacetonate as a dopant source has low solubility in water and alcohols. Therefore, it may be impossible to satisfactorily set the concentration when the solvent is the same as that for zinc acetate. However, it is possible to separately use a solvent (for example, acetylacetone) in which aluminum acetylacetonate is easily dissolved by using separate solution containers.

In the constitution of FIG. 4, only two solution containers 5, 9 are prepared and the respective solution containers 5, 9 accommodate different solutions 4, 8. The respective solutions 4, 8 are converted into mist by the respective misting devices 6, 10.

However, there may be employed such a constitution that the number of solution containers is three or more and the respective solution containers accommodate different solutions, and the respective solutions are converted into mist by each misting device arranged in each solution container.

Also in the case of the constitution that the number of the solution containers is three or more, different solutions converted into mist may be simultaneously supplied to the substrate 2 in accordance with control of the controller (not shown). Also, different solutions converted into mist may be separately supplied to the substrate 2 in a predetermined order in accordance with control of the controller. In the case of the constitution that the number of the solution containers is three or more, it is desired that each solution is supplied toward the substrate 2 in the reaction vessel 1 from the solution containers through different paths.

In the case of the constitution that two or more kinds of solutions are supplied, two or more kinds of solutions and ozone are supplied toward the substrate 2 disposed in the reaction vessel 1.

In this case, in accordance with control of the controller (not shown), while ozone is always supplied, different solutions may be separately supplied in a predetermined order. In accordance with control of the controller (not shown), different solutions may be separately supplied in a predetermined order and, after temporarily stopping supply of the solutions every time supply of the solutions is switched, ozone may be supplied (for example, supply of first solution→supply of ozone→supply of second solution-→supply of ozone→supply of third solution→supply of ozone). Herein, in any of the supply aspects, it is desired that each solution and ozone are supplied toward the substrate 2 in the reaction vessel 1 from the solution containers or the ozone generator 7 through different paths.

Herein, in the case of supplying two kinds of solutions and ozone, the atmosphere inside the reaction vessel 1 in which the substrate 2 is disposed may be an atmospheric pressure or a reduced pressure environment, as described in the embodiment 1.

<Embodiment 3>

Figure 5:
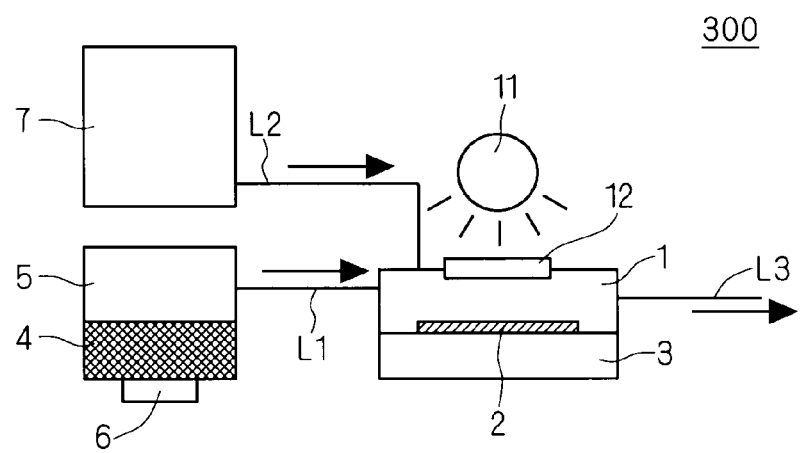
FIG. 5 is a diagram showing a constitution of an apparatus for forming a zinc oxide film or a magnesium zinc oxide film according to an embodiment 3.

FIG. 5 is a diagram showing a schematic constitution of an apparatus for forming a zinc oxide film or a magnesium zinc oxide film according to the present embodiment.

As shown in FIG. 5, concerning an apparatus 300 for forming a zinc oxide film or a magnesium zinc oxide film according to the embodiment 3, an ultraviolet generator 11 and an ultraviolet transmission window 12 are separately added to the apparatus 100 for forming a zinc oxide film or a magnesium zinc oxide film according to the embodiment 1.

The ultraviolet generator 11 is a portion where ultraviolet rays (wavelength: about 10 nm to 400 nm) are generated. Examples of the ultraviolet generator 11 capable of generating ultraviolet rays include a mercury lamp and an excimer lamp. Ultraviolet rays having wavelengths of 254 nm and 185 nm are generated from a low-pressure mercury lamp. When xenon, krypton and argon are used as cooling media, ultraviolet rays having wavelengths of 172 nm, 146 nm and 126 nm are respectively generated from an excimer lamp.

This kind of the ultraviolet generator 11 is composed of a discharge tube, an electrode disposed around the discharge tube, and a power supply which apply an AC voltage or a pulse voltage to the electrode through an electric supply line. An AC voltage or a pulse voltage is applied to the electrode by the power supply. Whereby, discharge can be generated inside the discharge tube, and ultraviolet rays are generated as a result of the discharge.

The ultraviolet generator 11 is arranged above the reaction vessel 1, in other words, arranged facing a first main surface, which is the surface on which the zinc oxide film or the magnesium zinc oxide film is formed, of the substrate 2.

As shown in FIG. 5, the ultraviolet transmission window 12, which transmits ultraviolet rays emitted from the ultraviolet generator 11, is provided at the upper portion of the reaction vessel 1. Specifically, the ultraviolet transmission window 12 is arranged at a portion of the reaction vessel 1 between the ultraviolet generator 11 and the substrate 2.

The ultraviolet transmission window 12 is made from a material which transmits ultraviolet rays. For example, the ultraviolet transmission window 12 is made from materials such as magnesium fluoride, calcium fluoride, barium fluoride, lithium fluoride, sodium fluoride, potassium fluoride, quartz and sapphire.

The film formation apparatus 300 has the same constitution as that of the film formation apparatus 100, except for the separately added constitution, and the same numerals are used for the same constitutions. Concerning the description of the same constitution and the operation of the constitution, refer to the embodiment 1.

The solution 4 converted into mist by the misting device 6 is supplied to the first main surface of the substrate 2 arranged in the reaction vessel 1 through the path L1. On the other hand, ozone produced by the ozone generator 7 is supplied to the first main surface of the substrate 2 arranged in the reaction vessel 1 through the path L2.

When the solution 4 and ozone are supplied, the substrate 2 is heated by the heating device 3 in the reaction vessel 1, and also the inside of the reaction vessel 1 above the substrate 2 is irradiated with ultraviolet rays produced by the ultraviolet generator 11 through the ultraviolet transmission window 12.

As a result of irradiation of ultraviolet rays, ozone supplied to the reaction vessel 1 is irradiated with ultraviolet rays. Whereby, oxygen radicals are produced from ozone in the reaction vessel 1.

Herein, in order to decompose ozone into oxygen radicals, it is desired to irradiate ozone with ultraviolet rays having a wavelength of 300 nm or less (particularly, a wavelength of about 254 nm). In order to activate the metal oxide film formed on the substrate 2, it is desired to irradiate ozone with ultraviolet rays having a wavelength of 400 nm or less (particularly, a wavelength of about 300 nm).

As described above, the apparatus 300 for forming a zinc oxide film or a magnesium zinc oxide film according to the present embodiment is provided with the ultraviolet generator 11 and the ultraviolet transmission window 12 which transmits ultraviolet rays. Also, the inside of the reaction vessel 1 to which ozone and the solution 4 are supplied is irradiated with ultraviolet rays.

Therefore, ozone is decomposed into oxygen radicals by irradiation with the ultraviolet rays, thus making it possible to promote the reaction for formation of a zinc oxide film or a magnesium zinc oxide film in the reaction vessel 1 (more specifically, on the first main surface of the substrate 2).

Since ozone to be supplied to the reaction vessel 1 is decomposed into oxygen radicals by irradiation with ultraviolet rays, it is possible to omit the heating device 3 for heating the substrate 2 in the film formation apparatus 300 shown in FIG. 5. This is because a zinc oxide film or a magnesium zinc oxide film is formed on the substrate 2 at about normal temperature (room temperature) by introducing the constitution of irradiation with ultraviolet rays.

However, the arrangement of the heating device 3 in the film formation apparatus 300 has the following advantage. In other words, like the constitution of FIG. 5, the heating device 3 is provided and the substrate 2 is heated to about 100° C., and then ozone is supplied and the ozone is irradiated with ultraviolet rays. Whereby, it is possible to further promote the reaction for formation of a zinc oxide film or a magnesium zinc oxide film on the substrate 2, compared with the constitution in which the heating device 3 is not provided.

In the present embodiment, since the reaction vessel 1 is provided with the constitution of irradiation with ultraviolet rays, oxygen may be supplied to the reaction vessel 1 in place of ozone. In other words, it is not necessary to generate ozone by the ozone generator 7, and oxygen may be supplied to the first main surface of the substrate 2 in the reaction vessel 1 through the path L2, followed by irradiation of oxygen supplied into the reaction vessel 1 with ultraviolet rays. Herein, together with oxygen, the misty solution 4 is supplied to the first main surface of the substrate 2 in the reaction vessel 1 through the path L1.

Oxygen radicals are produced from oxygen by irradiating oxygen with ultraviolet rays. Herein, in order to decompose oxygen into oxygen radicals, it is desired to irradiate oxygen with ultraviolet rays having a wavelength of 243 nm or less (particularly, a wavelength of about 172 nm).

Also in the present embodiment, based on control of a controller (not shown), the solution 4 converted into mist and ozone (or oxygen) are supplied into the reaction vessel 1 simultaneously or separately. Also in the present embodiment, it is desired to supply the solution 4 converted into mist and ozone (or oxygen) into the reaction vessel 1 through the different paths L1, L2. Furthermore, the solution 4 converted into mist and ozone (or oxygen) may be supplied to the substrate 2 arranged under an atmospheric pressure, or to the substrate 2 arranged under a reduced pressure (for example, 0.0001 to 0.1 MPa) environment.

In the above description, mention was made about the constitution in which the ultraviolet generator 11 and the ultraviolet transmission window 12 are separately added to the apparatus 100 for forming a zinc oxide film or a magnesium zinc oxide film according to the embodiment 1. However, there may be employed the constitution in which the ultraviolet generator 11 and the ultraviolet transmission window 12 are separately added to the film formation apparatus capable of supplying two or more kinds of solutions described in the embodiment 2 (see FIG. 6).

Figure 6:
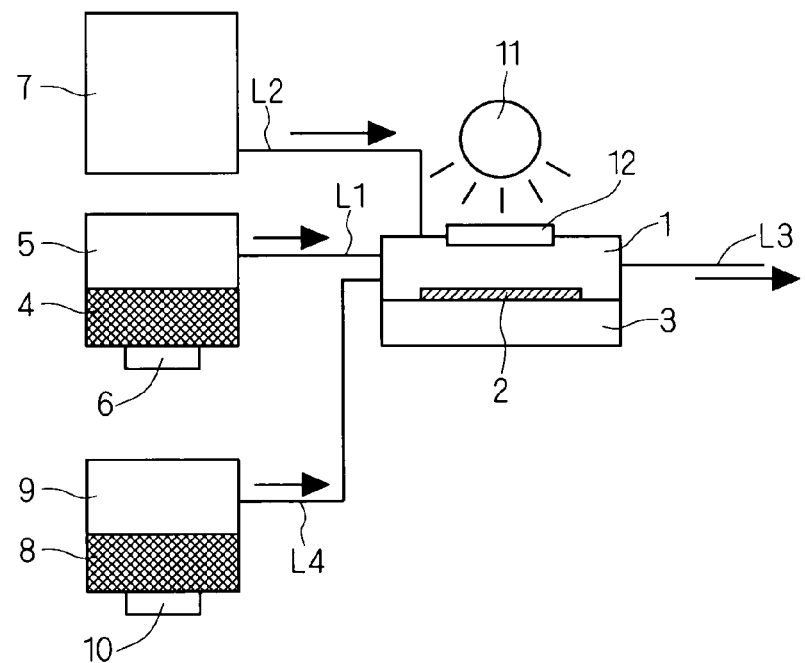
FIG. 6 is a diagram showing another constitution example of an apparatus for forming a zinc oxide film or a magnesium zinc oxide film according to the embodiment 3.

In the constitution shown in FIG. 6, as described in the embodiment 2, the different solutions 4, 8 converted into mist may be simultaneously supplied to the substrate 2 under control of a controller (not shown). Under control of the controller (not shown), the different solutions 4, 8 converted into mist may be separately supplied to the substrate 2 in a predetermined order. Also in these supply aspects, as described in the embodiment 2, it is desired that the respective solutions 4, 8 are supplied toward the substrate 2 in the reaction vessel 1 from the solution containers 5, 9 through the different paths L1, L4.

In the constitution example of FIG. 6, as described in the embodiment 2, while ozone (or oxygen) is always supplied under control of a controller (not shown), the different solutions 4, 8 converted into mist may be separately supplied in a predetermined order. Alternatively, under control of a controller (not shown), the different solutions 4, 8 converted into mist may be separately supplied in a predetermined order and, after temporarily stopping supply of the solutions 4, 8 every time supply of the solutions 4, 8 is switched, ozone (or oxygen) may be supplied (for example, supply of the solution 4→supply of ozone (or oxygen)→supply of the solution 8→supply of ozone (or oxygen)).

Herein, in any of the supply aspects, it is desired that the respective solutions 4, 8 and ozone (or oxygen) are supplied toward the substrate 2 in the reaction vessel 1 through the different paths L1, L2, L4.

<Embodiment 4>

Figure 7:
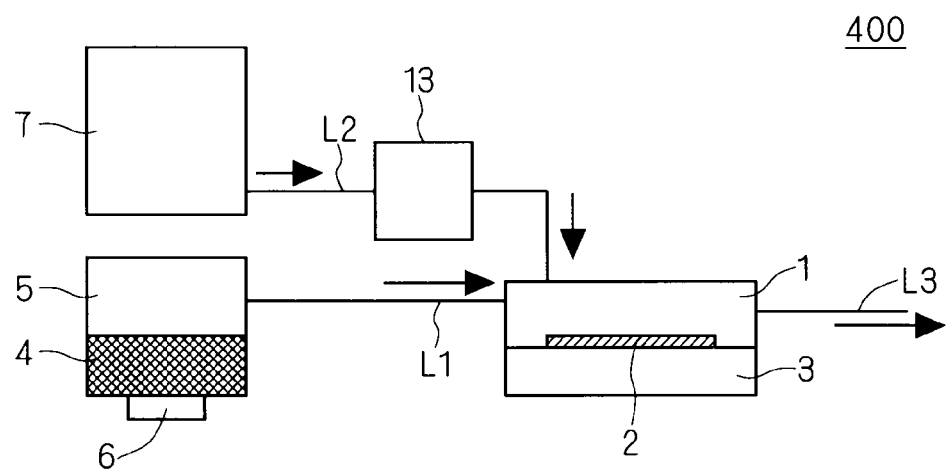
FIG. 7 is a diagram showing a constitution of an apparatus for forming a zinc oxide film or a magnesium zinc oxide film according to an embodiment 4.

FIG. 7 is a diagram showing a schematic constitution of an apparatus for forming a zinc oxide film or a magnesium zinc oxide film according to the present embodiment.

As shown in FIG. 7, concerning an apparatus 400 for forming a zinc oxide film or a magnesium zinc oxide film according to the embodiment 4, a plasma generator 13 is separately added to the apparatus 100 for forming a zinc oxide film or a magnesium zinc oxide film according to the embodiment 1.

The plasma generator 13 is provided on the way of the path L2 arranged between the ozone generator 7 and the reaction vessel 1. In the plasma generator 13, two electrodes are provided at a predetermined distance. When ozone is supplied between the electrodes to which a high frequency voltage is applied, the ozone is converted into plasma to produce oxygen radicals. Oxygen radicals produced in the plasma generator 13 are supplied into the reaction vessel 1 through the path L2.

The film formation apparatus 400 has the same constitution as that of the film formation apparatus 100, except for the separately added constitution, and the same numerals are used for the same constitutions. Concerning the description of the same constitution and the operation of the constitution, refer to the embodiment 1.

The solution 4 converted into mist by the misting device 6 is supplied to the first main surface of the substrate 2 arranged in the reaction vessel 1 through the path L1. On the other hand, ozone produced in the ozone generator 7 is decomposed into oxygen radicals in the plasma generator 13 on the way through the path L2, and then supplied to the first main surface of the substrate 2 arranged in the reaction vessel 1.

When the solution 4 and ozone (more specifically, oxygen radicals produced in the plasma generator 13) are supplied, the substrate 2 is heated by the heating device 3 in the reaction vessel 1.

Herein, the plasma generator 13 may be a device for converting ozone into plasma to produce oxygen radicals, and the position where the plasma generator 13 is arranged is not particularly limited to the constitution of FIG. 7. For example, it may be arranged just proximal to the reaction vessel 1 on the path L2, and the plasma generator 13 may be arranged in the reaction vessel 1.

As described above, the apparatus 400 for forming a zinc oxide film or a magnesium zinc oxide film according to the present embodiment is provided with the plasma generator 13. Also, ozone to be supplied to the reaction vessel 1 is decomposed in the plasma generator 13.

Therefore, ozone is decomposed into oxygen radicals by the plasma generator 13, thus making it possible to promote the reaction for formation of a zinc oxide film or a magnesium zinc oxide film in the reaction vessel 1 (more specifically, on the first main surface of the substrate 2).

Since ozone to be supplied toward the reaction vessel 1 from the ozone generator 7 is decomposed into oxygen radicals by the plasma generator 13, it is possible to omit the heating device 3 for heating the substrate 2 in the film formation apparatus 400 shown in FIG. 7. This is because a zinc oxide film or a magnesium zinc oxide film is formed even on the substrate 2 at about normal temperature (room temperature) by introducing the plasma generator 13.

However, the arrangement of the heating device 3 in the film formation apparatus 400 has the following advantage. In other words, like the constitution of FIG. 7, the heating device 3 is provided and the substrate 2 is heated to about 100° C., and then ozone is supplied and the ozone is converted into plasma using the plasma generator 13. Whereby, it is possible to further promote the reaction for formation of a metal oxide film on the substrate 2, compared with the constitution in which the heating device 3 is not provided.

In the present embodiment, because of being provided with the plasma generator 13 capable of converting ozone into plasma, oxygen may be supplied toward the reaction vessel 1 in place of ozone. In other words, it is not necessary to generate ozone by the ozone generator 7, and oxygen may be supplied toward the first main surface of the substrate 2 in the reaction vessel 1 through the path L2 and the oxygen maybe converted into plasma by the plasma generator 13 in the reaction vessel 1 or on the way of the path L2. Oxygen radicals are produced from oxygen by converting oxygen into plasma inside the plasma generator 13. Herein, together with oxygen, the misty solution 4 is supplied to the first main surface of the substrate 2 in the reaction vessel 1 through the path L1.

Also in the present embodiment, the solution 4 converted into mist and ozone (or oxygen) are supplied to the reaction vessel 1 simultaneously or separately (or in a predetermined order). Also in the present embodiment, it is desired to supply the solution 4 converted into mist and ozone (or oxygen) to the reaction vessel 1 through the different paths L1, L2. Furthermore, the solution 4 converted into mist and ozone (or oxygen) may be supplied to the substrate 2 arranged under an atmospheric pressure, or to the substrate 2 arranged under a reduced pressure (for example, 0.0001 to 0.1 MPa) environment.

In the above description, mention was made about the constitution in which the plasma generator 13 is separately added to the apparatus 100 for forming a zinc oxide film or a magnesium zinc oxide film according to the embodiment 1. However, there may be employed the constitution in which the plasma generator 13 is separately added to the film formation apparatus capable of supplying two or more kinds of solutions described in the embodiment 2 (see FIG. 8).

Figure 8:
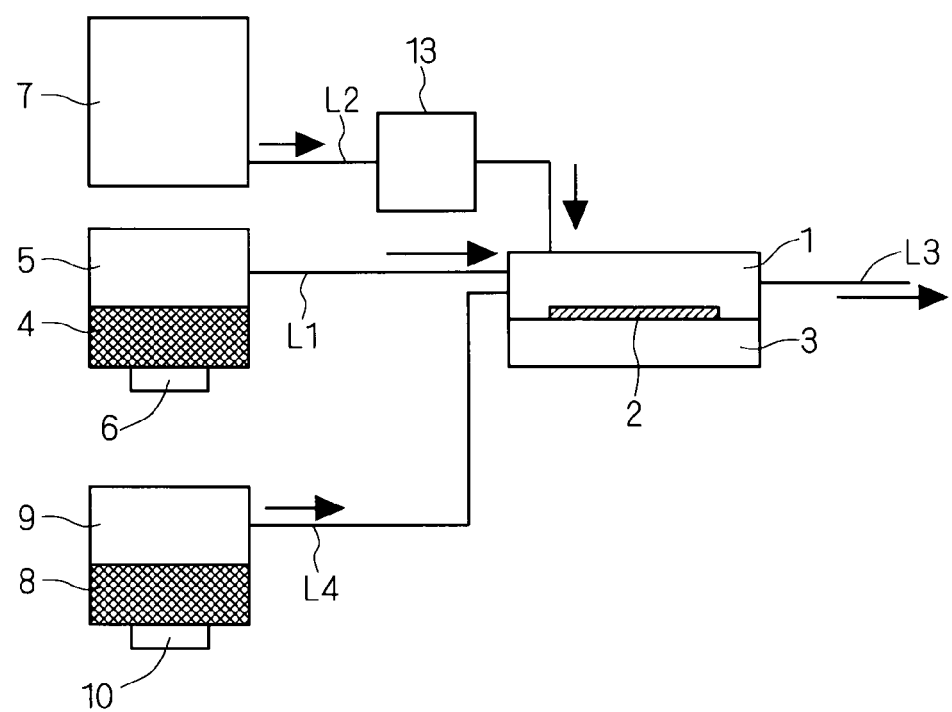
FIG. 8 is a diagram showing another constitution example of an apparatus for forming a zinc oxide film or a magnesium zinc oxide film according to the embodiment 4.

In the constitution shown in FIG. 8, as described in the embodiment 2, the different solutions 4, 8 converted into mist may be simultaneously supplied to the substrate 2. The different solutions 4, 8 converted into mist may be separately supplied to the substrate 2 in a predetermined order. Also in these supply aspects, as described also in the embodiment 2, it is desired that the respective solutions 4, 8 converted into mist are supplied toward the substrate 2 in the reaction vessel 1 from the solution containers 5, 9 through the different paths L1, L4.

In the constitution example of FIG. 8, as described in the embodiment 2, while ozone (or oxygen) is always supplied, the different solutions 4, 8 converted into mist may be separately supplied in a predetermined order. Alternatively, the different solutions 4, 8 converted into mist may be separately supplied in a predetermined order and, after temporarily stopping supply of the solutions 4, 8 every time supply of the solutions 4, 8 is switched, ozone (or oxygen) may be supplied (for example, supply of the solution 4→supply of ozone (or oxygen)→supply of the solution 8→supply of ozone (or oxygen)).

Herein, in any of the supply aspects, it is desired that the respective solutions 4, 8 and ozone (or oxygen) are supplied toward the substrate 2 in the reaction vessel 1 through the different paths L1, L2, L4.

As described above, unlike FIG. 8, the constitution capable of converting ozone (or oxygen) into plasma in the reaction vessel 1 may be employed. In this case, in the film formation apparatus described in the embodiment 2, the plasma generator 13 is arranged in the reaction vessel 1.

While the present invention has been described in detail, the above description is for illustrative purpose in all aspects and it is not to be construed restrictively. It will be understood that non-illustrated innumerable modifications are possible which nevertheless are within the scope of the present invention.

The invention claimed is:
1. A method, comprising:
(A) converting a solution comprising zinc or zinc and magnesium into a mist by applying ultrasonic waves to said solution, said solution present in a solution container;
(B) heating a substrate to a temperature sufficient to form a zinc oxide film or a zinc-magnesium oxide film by heating said substrate with a heating device in contact with said substrate to the sufficient temperature, thereby obtaining a heated substrate present in a reaction vessel; and
(C) supplying the mist from (A) through a path that connects the solution container to the reaction vessel, thereby applying the mist to a first main surface of the heated substrate from (B) and supplying ozone to the reaction vessel, thereby applying the ozone to a first main surface of the heated substrate from (B), thereby forming a zinc oxide or magnesium zinc oxide film on the first main surface of the heated substrate, said film having a thickness of from 350 to 680 nm and a transmittance of at least 90% for wavelengths of from 350 nm to 1,500 nm,
wherein said mist comprising zinc or zinc and magnesium and said ozone are introduced sequentially and separately into the reaction chamber, and
said zinc oxide film is a ZnO film and said magnesium zinc oxide film is a ZnMgO film.

2. The method of claim 1, wherein
the solution comprises a compound comprising either zinc or magnesium, and
the compound is at least one selected from the group consisting of an alkoxide compound, a β-diketone compound, a carboxylate compound, a halogen compound, an alkyl compound, and a cyclopentadienyl compound.

3. The method of claim 1, wherein the solution comprises at least one selected from the group consisting of boron, nitrogen, fluorine, aluminum, phosphorus, chlorine, gallium, arsenic, niobium, indium, and antimony.

4. The method of claim 1, wherein
the converting (A) comprises converting two or more different solutions into mist, and the supplying (C) comprises supplying each mist from the different solutions simultaneously, sequentially, or alternately.

5. The method of claim 1, wherein the supplying (C) comprises supplying the solution and the ozone simultaneously or alternately.

6. The method of claim 1, wherein the supplying (C) comprises supplying the solution and the ozone through different paths.

7. The method of claim 1, wherein the supplying (C) comprises supplying the solution and the ozone to the substrate under an atmospheric pressure.

8. The method of claim 1, wherein the supplying (C) comprises supplying the solution and the ozone to the substrate under a reduced pressure environment.

9. The method of claim 1, wherein
said mist comprising zinc or zinc and magnesium and said ozone are mixed only inside the reaction vessel.

10. The method of claim 1, wherein a powdered product from a reaction between said mist with ozone is not present on said zinc oxide film or said magnesium zinc oxide film.

11. A method, comprising:
(V) converting a solution comprising zinc or zinc and magnesium into a mist by applying ultrasonic waves to said solution, said solution present in a solution container;
(W) supplying the mist from (V) through path that connects the solution container to a reaction vessel, thereby applying the mist to a first main surface of a heated substrate present in the reaction vessel and ozone to a first main surface of the heated substrate, said substrate heated to a temperature sufficient to form a zinc oxide film or a zinc-magnesium oxide film; and
(X) irradiating the ozone with ultraviolet rays, thereby forming a zinc oxide or magnesium zinc oxide film on the first main surface of the heated substrate, said film having a thickness of from 350 to 680 nm and a transmittance of at least 90% for wavelengths of from 350 nm to 1,500 nm,
wherein said mist comprising zinc or zinc and magnesium and said ozone are introduced sequentially and separately into the reaction chamber, and
said zinc oxide film is a ZnO film and said magnesium zinc oxide film is a ZnMgO film.

12. The method of claim 11, wherein the supplying (W) comprises supplying the ozone to the heated substrate.

13. The method of claim 11, wherein the supplying (W) comprises supplying the solution and the ozone simultaneously or alternately.

14. The method of claim 11, wherein the supplying (W) comprises supplying the solution and the ozone through different paths.

15. The method of claim 11, wherein the supplying (W) comprises supplying the solution and the ozone to the substrate under an atmospheric pressure.

16. The method of claim 11, wherein the supplying (W) comprises supplying the solution and the ozone to the substrate under a reduced pressure environment.

17. The method of claim 11, wherein
the solution comprises a compound comprising either zinc or magnesium, and
the compound is at least one selected from the group consisting of an alkoxide compound, a β-diketone compound, a carboxylate compound, a halogen compound, an alkyl compound, and a cyclopentadienyl compound.

18. The method of claim 11, wherein the solution comprises at least one selected from the group consisting of boron, nitrogen, fluorine, aluminum, phosphorus, chlorine, gallium, arsenic, niobium, indium, and antimony.

19. The method of claim 11, wherein
the converting (V) comprises converting two or more different solutions into mist, and
the supplying (W) comprises supplying each mist from the different solutions simultaneously, sequentially, or alternately.

20. A method, comprising:
(V) converting a solution comprising zinc or zinc and magnesium into a mist by applying ultrasonic waves to said solution, said solution present in a solution container;
(W) supplying the mist from (V) to a reaction vessel comprising a substrate through path that connects the solution container to a reaction vessel, thereby applying the mist to a first main surface of a substrate present in the reaction vessel and supplying ozone to a first main surface of a substrate;
(X) converting the ozone inside the reaction vessel into plasma; and
reacting the zinc or zinc and magnesium mist from (V) on the first main surface of said substrate in the presence of the plasma form of ozone, thereby forming a zinc oxide or magnesium zinc oxide film on the substrate, said film having a thickness of from 350 to 680 nm and a transmittance of at least 90% for wavelengths of from 350 nm to 1,500 nm,
wherein said mist comprising zinc or zinc and magnesium and said ozone are introduced sequentially and separately into the reaction chamber, and
said zinc oxide film is a ZnO film and said magnesium zinc oxide film is a ZnMgO film.

21. The method of claim 20, wherein the supplying (W) comprises supplying the ozone to the heated substrate.

22. The method of claim 20, wherein
the solution comprises a compound comprising either zinc or magnesium, and
the compound is at least one selected from the group consisting of an alkoxide compound, a β-diketone compound, a carboxylate compound, a halogen compound, an alkyl compound, and a cyclopentadienyl compound.

23. The method of claim 20, wherein the solution comprises at least one selected from the group consisting of boron, nitrogen, fluorine, aluminum, phosphorus, chlorine, gallium, arsenic, niobium, indium, and antimony.

24. The method of claim 20, wherein
the converting (V) comprises converting two or more different solutions into mist, and
the supplying (W) comprises supplying each mist from the different solutions simultaneously, sequentially, or alternately.

25. The method of claim 20, wherein the supplying (W) comprises supplying the solution and the ozone simultaneously or alternately.

26. The method of claim 20, wherein the supplying (W) comprises supplying the solution and the ozone through different paths.

27. The method of claim 20, wherein the supplying (W) comprises supplying the solution and the ozone to the substrate under an atmospheric pressure.

28. The method of claim 20, wherein the supplying (W) comprises supplying the solution and the ozone to the substrate under a reduced pressure environment.

29. The method according to claim 20, wherein said converting is carried out in a plasma generator that is located between and connected to an ozone supply source and a reactor in which said reacting is carried out.

* * * * *